(12) United States Patent
Yoshida et al.

(10) Patent No.: US 7,365,529 B2
(45) Date of Patent: Apr. 29, 2008

(54) TEST STRUCTURE DESIGN FOR RELIABILITY TEST

(75) Inventors: Naomi Yoshida, Sunnyvale, CA (US); Toshiyuki Nagata, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 54 days.

(21) Appl. No.: 11/465,646

(22) Filed: Aug. 18, 2006

(65) Prior Publication Data

US 2007/0013363 A1   Jan. 18, 2007

Related U.S. Application Data

(62) Division of application No. 10/997,267, filed on Nov. 24, 2004, now Pat. No. 7,119,571.

(51) Int. Cl.
*G01R 31/28* (2006.01)

(52) U.S. Cl. .................................. 324/158.1

(58) Field of Classification Search ................ 324/760, 324/765, 158.1, 716, 537; 257/48, 767, 773–776, 257/920; 438/17, 468
See application file for complete search history.

(56) References Cited

U.S. PATENT DOCUMENTS

| | | | |
|---|---|---|---|
| 3,974,443 A * | 8/1976 | Thomas | 324/716 |
| 6,320,391 B1 * | 11/2001 | Bui | 324/537 |
| 6,362,638 B1 | 3/2002 | Ashton et al. | |
| 6,570,181 B1 | 5/2003 | Graas et al. | |
| 6,603,321 B2 | 8/2003 | Filippi et al. | |
| 6,680,484 B1 | 1/2004 | Young | |
| 6,822,437 B1 | 11/2004 | Hau-Riege et al. | |

* cited by examiner

*Primary Examiner*—Ha Tran Nguyen
*Assistant Examiner*—Tung X. Nguyen
(74) *Attorney, Agent, or Firm*—Patterson & Sheridan, LLP

(57) ABSTRACT

A flexible semiconductor test structure that may be incorporated into a semiconductor device is provided. The test structure may include a plurality of test pads designed to physically stress conductive lines to which they are attached during thermal cycling. By utilizing test pads with different dimensions (lengths and/or widths), the effects of thermal stress generated by a plurality of conductive lines having corresponding different dimensions may be simulated.

7 Claims, 5 Drawing Sheets

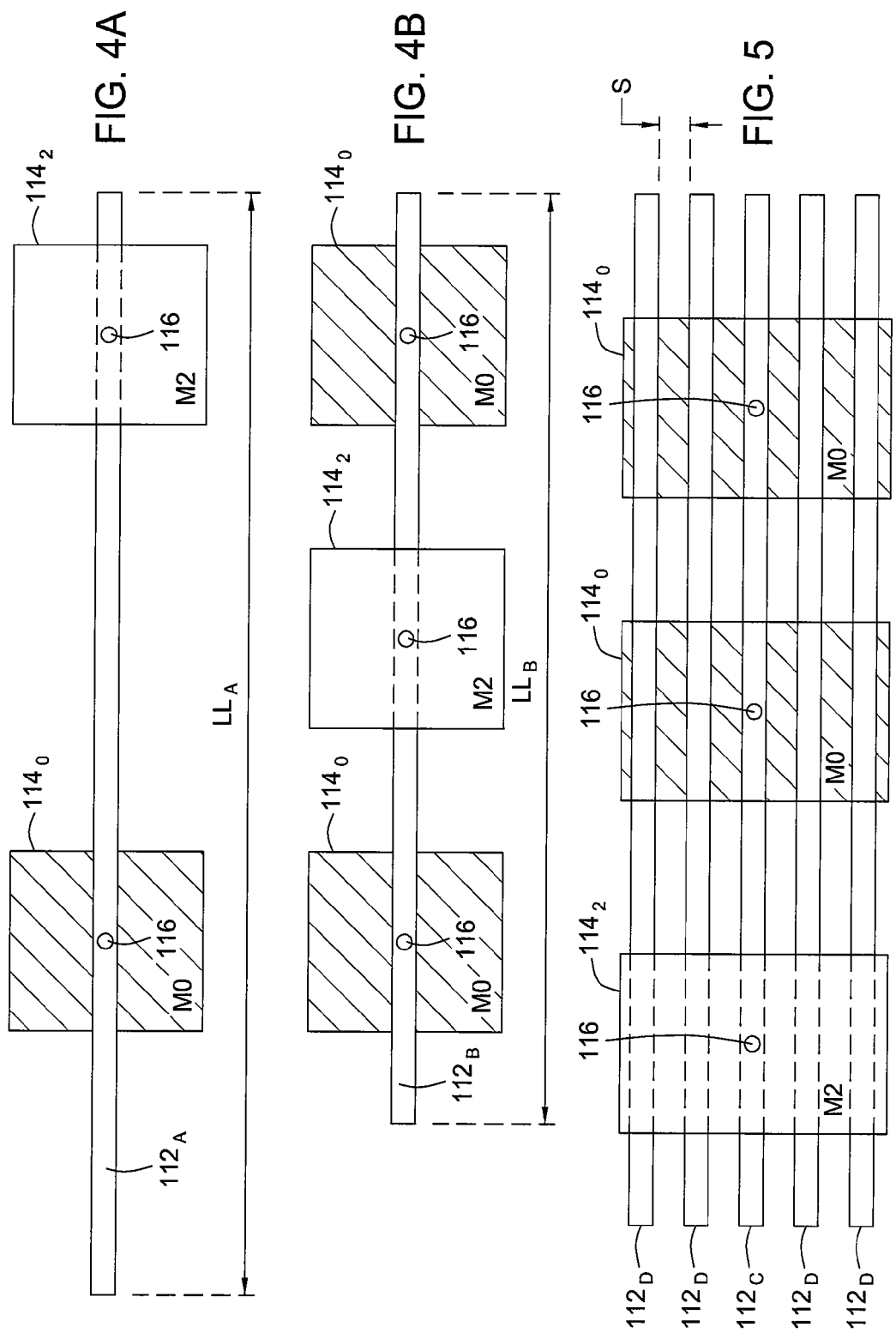

4 TERMINAL LINE RESISTANCE MEASURMENT

4 TERMINAL VIA RESISTANCE MEASURMENT

TEST STRUCTURE DESIGN FOR RELIABILITY TEST

CROSS-REFERENCE TO RELATED APPLICATIONS

This application is a divisional of U.S. patent application Ser. No. 10/997,267, filed Nov. 24, 2004 now U.S. Pat. No. 7,119,571.

BACKGROUND OF THE INVENTION

1. Field of the Invention

Embodiments of the present invention generally relate to semiconductor manufacturing and, more particularly, to test structures formed in a semiconductor device useful in evaluating possible device design parameters.

2. Description of the Related Art

In a semiconductor device, an interconnect structure consisting of a network of conductive lines connected by vias transmitting signals among various layers of the device. As circuit dimensions shrink to provide devices with more and more functionality, the conductive lines used in interconnect structures decrease in width accordingly. As these conductive lines shrink in width, the conductive lines become more susceptible to effects, such as electromigration, which may result in voids formatting in the conductive lines. Physical stresses can also form the voids, such as thermal stresses resulting from differences in temperature coefficients between dielectric layers and metallization layers.

A void generally refers to a decrease in the volume of metal in the conductive path of the line that results in increased line resistance which may in turn lead to signal degradation and, ultimately, device failure. Therefore, test structures designed to detect voids are commonly incorporated into device designs at the wafer level. A conventional test structure may include a conductive line in one metal layer coupled by a single conductive via to a conductive line having a different line width in another metal layer. The parameters of the test structure, such as the widths of the conductive lines, as well as the dimensions of the via, are chosen to mirror those that will likely be used in a final design.

Such test structures typically allow voids to be detected by providing test points (probe pads) allowing line and/or via resistance to be monitored during a test process. The test process may involve taking baseline line/via resistance measurements (using the probe pads) prior to placing a wafer containing the test structure in an oven to generate, in an accelerated manner, the type of thermal stress a device may encounter during its operational lifetime. After stressing the wafer in the oven (e.g., for several days at a given temperature or cycle of temperatures), resistance measurements may be repeated and compared to the baseline measurements. Any increasing "shift" in the resistance measurements may indicate the presence of voids formed in the lines and/or vias caused by the temperature stressing.

Such a test process may be used both during the manufacturing stage to detect voids and identify failing devices, as well as during the design stage to help determine design parameters (e.g., line widths, via sizes, via/line densities, and via/line ratios) that result in a reliable device. In other words, due to the complex nature of the physical stresses on a conductive line, characterizing or predicting the stresses caused by any particular combination of design parameters is extremely difficult. Therefore, stress testing different parameter combinations in a device to determine their reliability would be desirable.

The simple design of the conventional test structures limits their utility to test different combinations of parameters. In order to evaluate multiple combinations of different line widths and via sizes, multiple test structures would have to be constructed, each utilizing a different combination of potential design parameters to be evaluated. However, constructing multiple test structures is time consuming and expensive.

Accordingly, what is needed is a single test structure that facilitates the evaluation of multiple design parameters.

SUMMARY OF THE INVENTION

The present invention generally provides semiconductor test structures that facilitate the evaluation of multiple design parameters and a method utilizing such a test structure.

One embodiment provides a test structure for determining the reliability of conductive lines formed in a semiconductor substrate. The test structure generally includes at least one conductive line formed in a first metal layer of the semiconductor substrate and one or more thermal stress-inducing test pads formed in a second metal layer of the semiconductor substrate, wherein each of the test pads is wider in at least two dimensions than a line width of the conductive line. One or more vias electrically and mechanically couple the first one or more test pads to the first conductive line. A plurality of probe contact pads are electrically coupled to the first conductive line at different locations, and allow the measurement of at least one of line resistance of the first conductive line or the resistance across one or more of the vias.

Another embodiment provides another test structure for determining the reliability of conductive lines formed in a semiconductor substrate. The test structure generally includes at least one conductive line formed in a first metal layer of the semiconductor substrate and one or more thermal stress-inducing test pads formed in a second metal layer of the semiconductor substrate, wherein each of the test pads is wider in at least two dimensions than a line width of the conductive line. One or more vias electrically and mechanically couple the test pads to the first conductive line. A plurality of conductive dummy lines are formed in the first metal layer adjacent the first conductive line, wherein the dummy lines are not coupled to test pads formed in the second metal layer.

Another embodiment provides a method for evaluating parameters of a semiconductor design. The method generally includes generating a semiconductor test structure with at least one conductive line formed in a first metal layer coupled by a plurality of conductive vias to a plurality of thermal stress-inducing conductive test pads in a second metal layer by a plurality of conductive vias and taking and recording one or more baseline resistance measurements across at least one of the vias or at least one section of the at least one conductive line. The method further includes exposing the test structure to one or more elevated temperatures to generate thermal stress on the test structure, taking and recording one or more stressed resistance measurements across at least one of the vias or at least one section of the at least one conductive line after exposing the test structure to the one or more elevated temperatures, and comparing the stressed resistance measurements to the baseline resistance measurements in order to detect voids formed in at least one of the conductive line or the vias.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3-5 illustrate exemplary test structures with different pad and via arrangements, in accordance with various embodiments of the present invention.

DETAILED DESCRIPTION

The present invention generally provides a flexible semiconductor test structure that may be incorporated into a semiconductor device. The test structure may include a plurality of test pads designed to physically stress conductive lines to which they are attached during thermal cycling. In some applications, by utilizing test pads with different dimensions (lengths and/or widths), the effects of thermal stress generated by a plurality of conductive lines having corresponding different dimensions may be simulated. As a result, designers may utilize such test structures to determine design parameters (e.g., line/via widths, densities, and ratios) that should result in a device which operates reliably over its expected lifetime. By evaluating multiple combinations of such parameters with a single test structure, development costs and the time it typically takes to bring such a device to market may both be reduced significantly.

An Exemplary Test Structure

Figure 1:
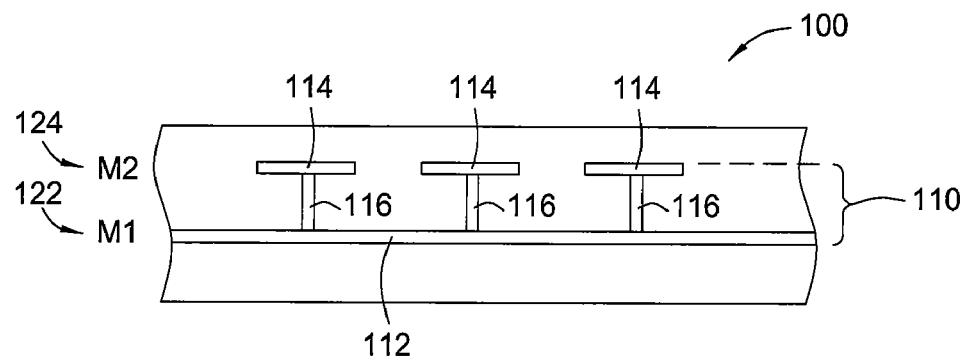
FIG. 1 illustrates an exemplary semiconductor device incorporating a test structure in accordance with the present invention.

FIG. 1 illustrates an exemplary semiconductor device 100 incorporating a test structure 110 in accordance with the present invention. As illustrated, the test structure 110 may include at least one conductive line 112 formed in a first metal layer (M1) 122 of the device 100 and a plurality of test pads 114 formed in a second metal layer (M2) 124 of the device 100. The test pads 114 are each electrically and mechanically coupled with the line 112 by a plurality of conductive vias 116. While not shown in FIG. 1, the test structure 110 may also include terminals (or "probe pads") electrically coupled with the line 112 that allow the resistance across portions of the line 112 (line resistance) and/or the resistance across vias 116 (via resistance) to be measured in order to detect voids in the test structure.

As will be described in greater detail below, within the same test structure 110, the number of pads 114 coupled to each line 112, as well as the pad density (number of pads in a given area) and other parameters, such as a width and length of the pads 114 may vary substantially, in an effort to gain insight into the reliability of different combinations of design parameters. The number of lines 112 and their dimensions (line width and/or length) may also vary.

Figure 2A:
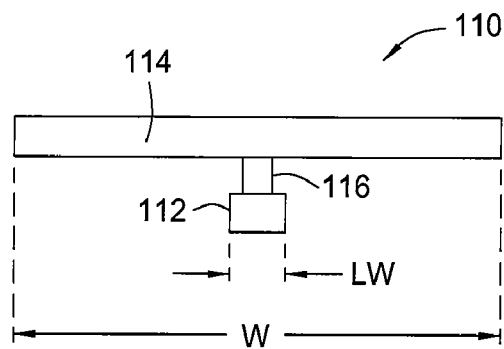
FIGS. 2A and 2B illustrate cross-sectional end and top views, respectively, of an exemplary test structure in accordance with the present invention.
Figure 2B:
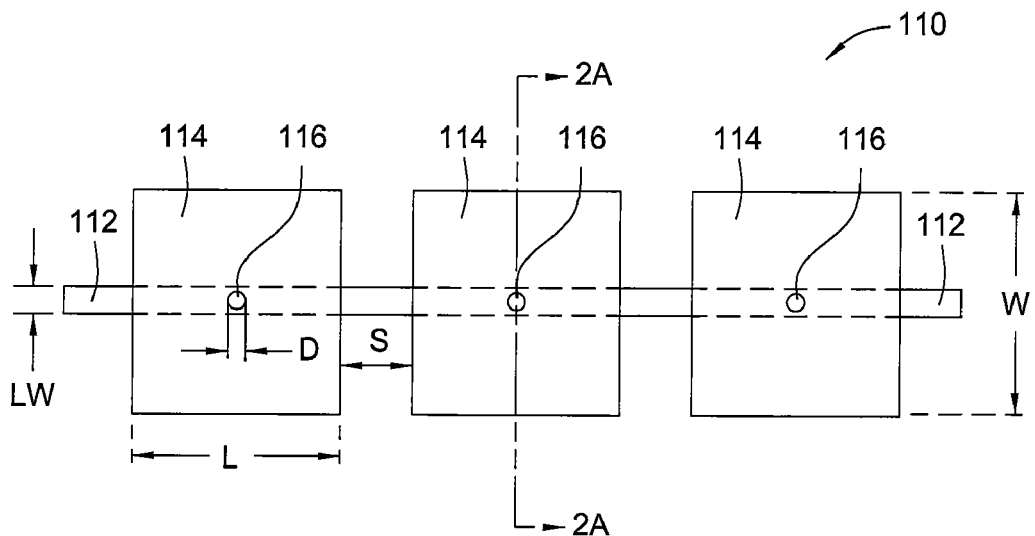

FIGS. 2A and 2B illustrate cross-sectional end and top views, respectively, of an exemplary test structure 110 in accordance with the present invention. As illustrated in FIG. 2A, the width of each pad 114 (pad width W) will typically be greater than width of the line 112 (line width LW). As an example, for some embodiments, one or more pads 114 in the test structure 110 may have a pad width of approximately 20 um and be connected to a line 112 having a line width of approximately 0.12 um.

Referring to the top view of FIG. 2B, the length of each pad 114 (pad length L) may be substantially the same as its pad width or may be different. Further, while rectangular pads 114 are shown, pads 114 may generally be any type shape, with the general desired feature of providing a substantially large area of metal (or other conductive material) above/below the line 112. Among other parameters of the test structure 110 that may be varied are the dimensions of the vias 116. For example, assuming round vias 116 are used, different via diameters D may be utilized to test different via/line ratios.

As previously described, the exact arrangement of lines 112, pads 114, and vias 116 in one or more sections of a test structure 110 may be strategically selected in an effort to simulate a particular combination of design parameters of interest. FIGS. 3-5 illustrate exemplary test structures with different line, pad, and via arrangements, in accordance with various embodiments of the present invention. It should be understood, however, that any number of the following arrangements may be combined in a single test structure 110, for example, to test different corresponding design feature combinations in parallel.

Figure 3A:
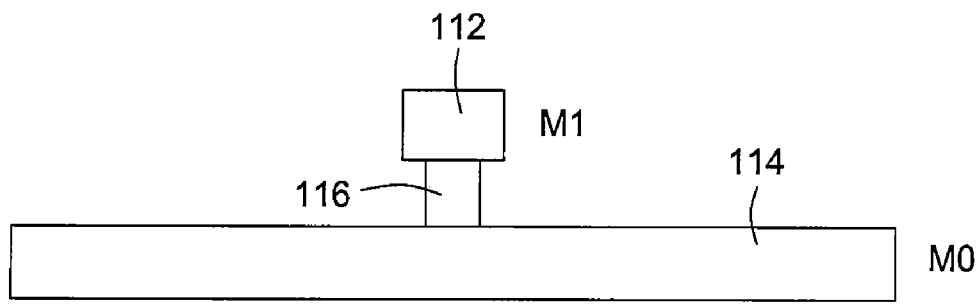
Figure 3B:
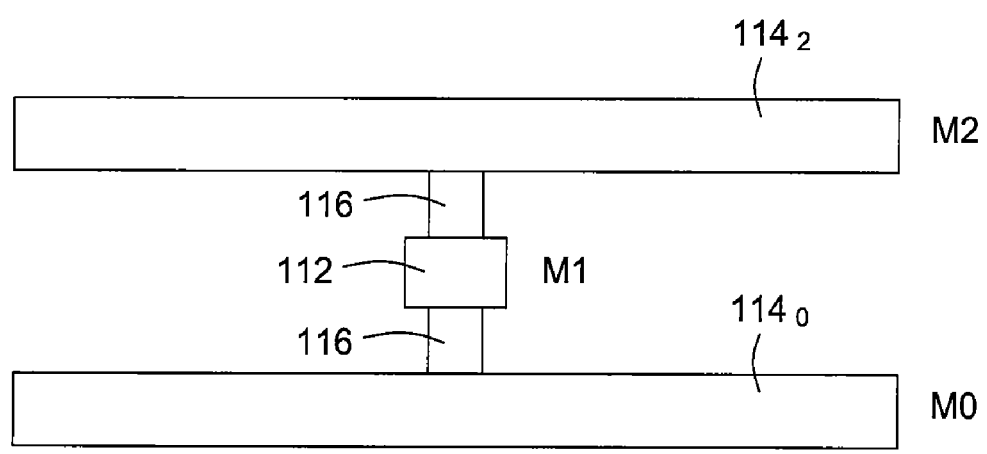

As illustrated in FIG. 3A, pads 114 need not be placed in metal layers above a line 112 (illustratively shown in a metal layer M1), but may also be placed in one or more lower layers (e.g., metal layer M0). Further, as illustrated in FIG. 3B, pads $114_2$ and $114_0$ may be placed both above and below a line 112 (e.g., in metal layers M0 and M2, respectively). While only three metal layers (M0-M2) are shown, it should be understood that test structures may include arrangements of lines, pads, and vias, that span many more layers. In fact, in some cases, such test structures may be used for the purpose of determining how many metal layers may or should be used for interconnections without sacrificing reliability.

As illustrated in the top views shown in FIGS. 4A and 4B, a different number of pads $114_2$ and $114_0$ in different layers may be coupled to different lines $112_A$ and $112_B$. Further, as illustrated, the different lines $112_A$ and $112_B$ may have different line lengths $LL_A$ and $LL_B$. While not illustrated, different lines 112 may also have different line widths (LW) as previously described. In some cases, a single test structure may include lines 112 with a wide range of line widths, in an effort to determine a minimum line width that may be used without sacrificing reliability. Similarly, the number of pads 114 on various levels above such lines 112, as well as the dimensions of vias 116, may be varied widely in an effort to determine acceptable dimensions of wiring on different layers coupled by vias 116. As previously described, each pad 114 may, in effect, serve to compactly simulate a wire of the same width, allowing multiple wire widths to be evaluated in a single test structure.

As illustrated in FIG. 5, additional lines $112_D$ (hereinafter, "dummy lines") that are not connected to pads 114 may be formed around a single line $112_C$ that is connected to the pads 114 (i.e., none of the dummy lines $112_D$ are connected to the pads 114 by vias 116). In some cases, the addition of the dummy lines $112_D$ may serve to reduce the amount of stress on the connected line $112_C$, possibly by displacing some of the dielectric material (which typically has a different temperature coefficient) disposed between lines $112_C$. In any case, resistance measurements during stress testing that show reduced shifts in line and/or via resistance in areas of the test structure 110 that include dummy lines $112_D$, may lead a designer to include dummy lines $112_D$ in a final device. The same test structure 110 may include different sections with different numbers of dummy lines, dummy lines with different spacing S, and dummy lines of different dimensions, in an effort to determine an optimum arrangement.

An Exemplary Test Method

Figure 6:
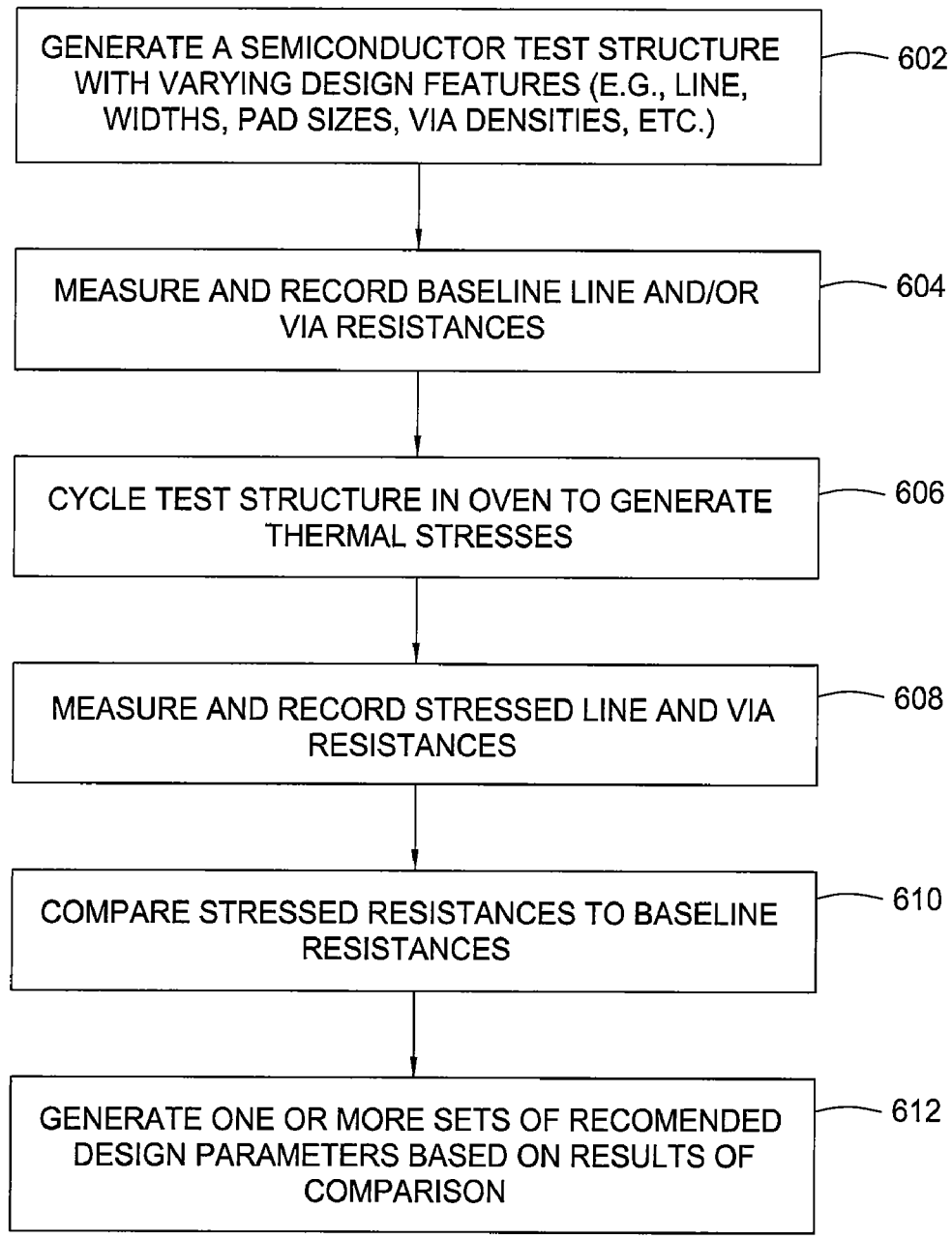
FIG. 6 is a flow diagram of an exemplary method for evaluating semiconductor design parameters in accordance with embodiments of the present invention.

FIG. 6 is a flow diagram of an exemplary method for evaluating semiconductor design parameters, utilizing the test structures described herein, in accordance with embodiments of the present invention. The method is designed to detect thermal stress-induced voids (formed in lines 112 or vias 116) by monitoring changes in line and/or via resistances after temperature cycling a semiconductor device containing a test structure designed to evaluate various combinations of design features.

The method begins, at step 602, by generating a semiconductor test structure with varying design features (line widths, pad sizes, via densities, etc.). At step 604, baseline line and/or via resistances for the test structure are measured and recorded. In order to be able to later determine the exact locations of voids in the test structure line and/or via resistance measurements may be taken at several locations about the test structure. Any suitable type of measurement technique may be used to take these resistance measurements.

Figure 7A:
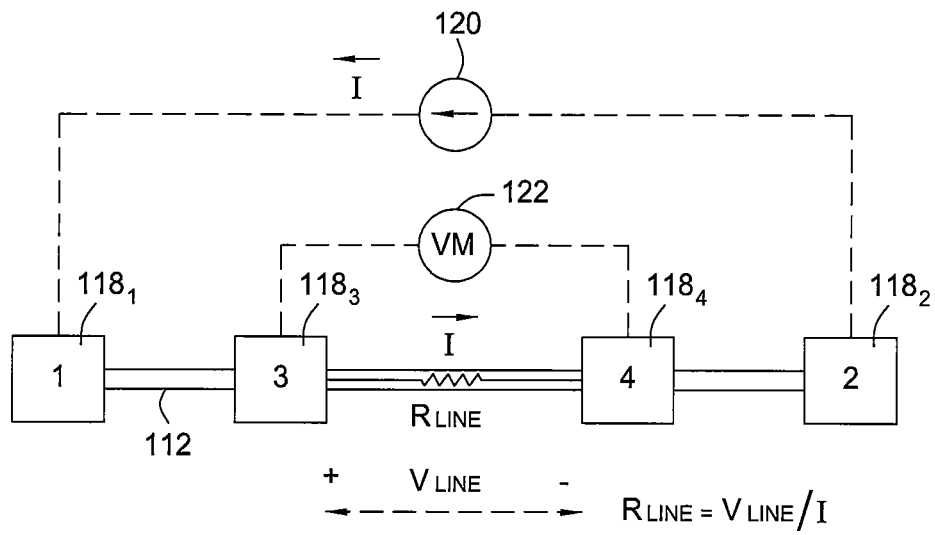
FIGS. 7A and 7B illustrate exemplary schematic diagrams for a four-terminal line and a four terminal via for making resistance measurements, respectively.
Figure 7B:
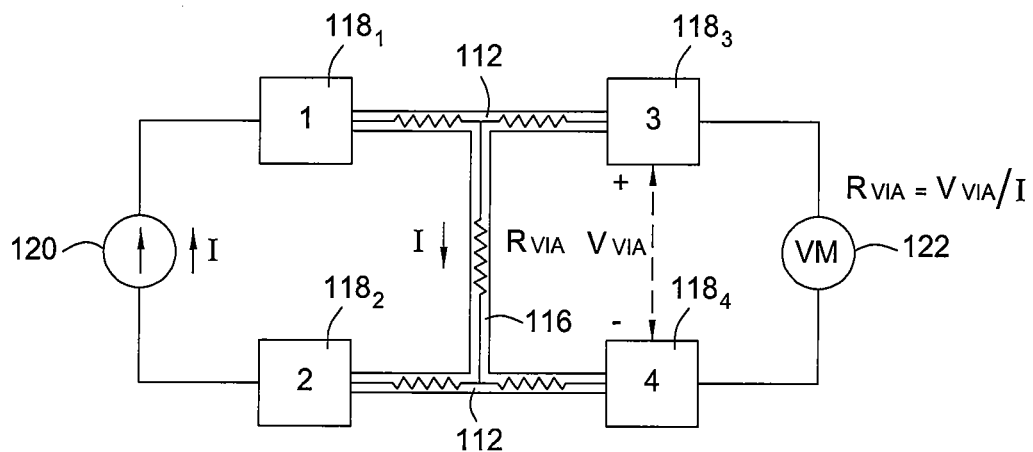

For some embodiments, these resistance measurements may be taken using what is commonly referred to as a "four-terminal" resistance measurement technique. The four-terminal resistance measurement technique is typically regarded as more accurate than "two-terminal" resistance measurements, particularly in instances when test lead resistance becomes a significant factor. FIGS. 7A and 7B illustrate exemplary schematic diagrams for a four-terminal line and a four terminal via for making resistance measurements, respectively. As illustrated in FIG. 7A, the line resistance (shown as $R_{LINE}$) of a section of line 112 between two probe pads $118_3$ and $118_4$ may be measured by supplying a current (I) through the section from a current source 120 attached to two other probe pads $118_1$ and $118_2$. The line resistance is calculated by dividing the resulting voltage potential across the pads $118_3$ and $118_4$ with a voltmeter 122. As illustrated in FIG. 7B, the via resistance (shown as $R_{VIA}$) across a via 116 connecting two lines 112 at different metal layers may be measured by supplying a current (I) through the via 116 from a current source 120 attached to two probe pads $118_1$ and $118_2$ at the different metal layers. The via resistance is calculated by dividing the resulting voltage potential across the via 116 with the voltmeter 122 attached to pads $118_3$ and $118_4$ located at the different metal layers.

Referring back to FIG. 6, at step 606, the test structure is placed in an oven and is subjected to a cycle of high temperature in order to generate thermal stress on the lines 112 via the pads 118. The exact temperatures cycles and times will vary and may depend on a particular application. As previously described, thermal stresses on the lines 112 and/or vias 116 caused by the temperature cycling may result in voids which may cause a measurable shift (increase) in the line and/or via resistances. Therefore, after the temperature cycling is complete, the "stressed" line and/or via resistances are again measured and recorded, at step 608. At step 610, these stressed resistances are compared to the baseline resistances (measured at step 604).

For some embodiments, the results of the resistance comparison may be analyzed to determine particular portions of the test structure that exhibit voids after the temperature cycling. Particular combinations of design features targeted for evaluation by such failing portions may be identified as unreliable for a given design. On the other hand, combinations of design features for portions of the test structure that did not exhibit voids (e.g., portions with minimal shifts in resistance after stress testing), may be identified as reliable for a given design. The comparison results may be analyzed by a fully-automated or computer-aided process. In any case, the final result of this testing may be presented as a set of one or more recommended combinations of design parameters, generated at step 612, based on the results of the resistance comparison.

By providing a flexible semiconductor test structure that may be incorporated into a semiconductor device, multiple combinations of design features may be evaluated in a single test process. Utilizing such a test structure in this manner, a recommended set of design parameters that result in a reliable device may be determined quickly. As a result, development costs and the time it typically takes to bring a reliable device to market may both be reduced significantly.

While the foregoing is directed to embodiments of the present invention, other and further embodiments of the invention may be devised without departing from the basic scope thereof, and the scope thereof is determined by the claims that follow.

What is claimed is:

1. A method for evaluating parameters of a semiconductor design, comprising:

generating a semiconductor test structure with at least one conductive line formed in a first metal layer coupled with a plurality of thermal stress-inducing conductive test pads in a second metal layer by a plurality of conductive vias;

taking and recording one or more baseline resistance measurements across at least one of the vias or at least one section of the at least one conductive line;

exposing the test structure to one or more elevated temperatures to generate thermal stress on the test structure;

taking and recording one or more stressed resistance measurements across at least one of the vias or at least one section of the at least one conductive line after exposing the test structure to the one or more elevated temperatures; and comparing the stressed resistance measurements to the baseline resistance measurements in order to detect voids formed in at least one of the conductive line or the vias.

2. The method of claim 1, wherein dimensions of the test pads are selected to simulate wire lengths that may be used in the second metal layer in a final design.

3. The method of claim 1, wherein dimensions of at least two of the test pads are different.

4. The method of claim 1, wherein the test structure also comprises test pads in a third metal layer coupled to the conductive line by vias, wherein the first metal layer is between the second and third metal layers.

5. The method of claim 1, further comprising forming dummy lines in the first metal layer adjacent the conductive line, wherein the dummy lines are not coupled to the test pads.

6. The method of claim 1, further comprising:
   forming probe contact pads electrically coupled to the first conductive line at different locations; and
   wherein taking the resistance measurements comprises taking four-terminal resistance measurements by supplying a current via two of the probe contact pads and measuring a potential voltage across a different two of the probe contact pads.

7. The method of claim 1, further comprising generating a set of recommended design parameter combinations based on the results of comparing the stressed resistance measurements to the baseline resistance measurements.

* * * * *